(12) United States Patent
Sudou et al.

(10) Patent No.: US 6,509,803 B2
(45) Date of Patent: Jan. 21, 2003

(54) VOLTAGE-CONTROLLED OSCILLATOR HAVING SHORT SYNCHRONOUS PULL-IN TIME

(75) Inventors: Kazuo Sudou, Tokyo (JP); Hiroyuki Yamada, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/900,855

(22) Filed: Jul. 10, 2001

(65) Prior Publication Data

US 2002/0027478 A1 Mar. 7, 2002

(30) Foreign Application Priority Data

Jul. 10, 2000 (JP) ........................................ 2000-208555

(51) Int. Cl.[7] ............................................... H03B 27/00
(52) U.S. Cl. ............................. 331/46; 331/47; 331/57
(58) Field of Search ............................. 331/47, 48, 57, 331/56, 107, 34, 46

(56) References Cited

U.S. PATENT DOCUMENTS 5,357,217 A * 10/1994 Marchesi et al. ............ 331/57
5,864,258 A * 1/1999 Cusinato et al. ............ 331/34
6,259,330 B1 * 7/2001 Arai ........................... 331/57

* cited by examiner

Primary Examiner—Tuan T. Lam
Assistant Examiner—Hiep Nguyen
(74) Attorney, Agent, or Firm—Volentine Francos, PLLC

(57) ABSTRACT

A voltage-controlled oscillator comprises a control terminal applied to a control voltage, first and second output terminals, first and second ring oscillators, first and second output buffer circuits and a latch circuit. Each of the first and second ring oscillators includes an odd number of inverting amplifier circuits connected in series and a transfer gate circuit connected between the inverting amplifier circuits and a resistive element connected in parallel to the transfer transistor. The transfer gate circuit includes a transfer transistor connected between the inverting amplifier circuits. The transfer gate circuit has a control terminal connected to the control terminal. Each of the first and second output buffer circuits has an input connected to the first or second ring oscillator and an output connected to the first or second output terminal. The latch circuit is connected to the first and second ring oscillators. The latch circuit controls the first and second ring oscillators so as to output complement oscillation signals.

7 Claims, 3 Drawing Sheets

VOLTAGE-CONTROLLED OSCILLATOR HAVING SHORT SYNCHRONOUS PULL-IN TIME

BACKGROUND OF THE INVENTION

1. Field of the Invention

The present invention relates to a voltage-controlled oscillator (hereinafter called "VCO") whose oscillation frequency can be controlled according to a control voltage.

2. Description of the Related Art

A conventional VCO has ring oscillators each comprised of a plurality of inverters and a transfer gate (hereinafter called "TG") connected in ring form. An oscillating operation of the VCO is performed at a frequency corresponding to a loop delay time of each ring oscillator. The loop delay time corresponds to the sum of delay times of the inverters and a delay time of the TG. The delay time of each TG changes according to a control voltage supplied to a control terminal. Namely, when the control voltage is lowered, the TG increases in channel resistance to thereby make an increase in delay time, whereby an oscillation frequency is reduced. When the control voltage is raised in reverse, the TG is reduced in channel resistance to thereby make a decrease in delay time, whereby an oscillation frequency increases. It is thus possible to control the oscillation frequency over a relatively wide range.

However, the conventional VCO has the following problems.

One of them is that since the frequency to be fixed is already determined when, for example, the VCO is used to configure a phase-locked loop (hereinafter called "PLL"), a synchronous pull-in time at phase synchronization becomes long under the influence of a wide frequency control range that would be a characteristic of the conventional VCO.

Further, another is that due to insertion losses and gate capacitance of field-effect transistors (hereinafter called "FETs") constituting each TG, a delay time increases and hence the upper limit of an oscillation frequency is restricted.

SUMMARY OF THE INVENTION

An object of the present invention is to provide a VCO which obtains a high oscillation frequency and is short in synchronous pull-in time when it is used in PLL.

In order to solve the above problems, the present invention provides a VCO comprising inverting amplifier circuits each comprised of an odd number of inverting amplifiers connected in tandem, feedback transistors which are connected between the outputs and inputs of the inverting amplifier circuits and whose conducting states are controlled according to a control voltage supplied to control electrodes thereof, respectively, and feedback resistors each connected in parallel with the feedback transistor between the output and input of the inverting amplifier circuit.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
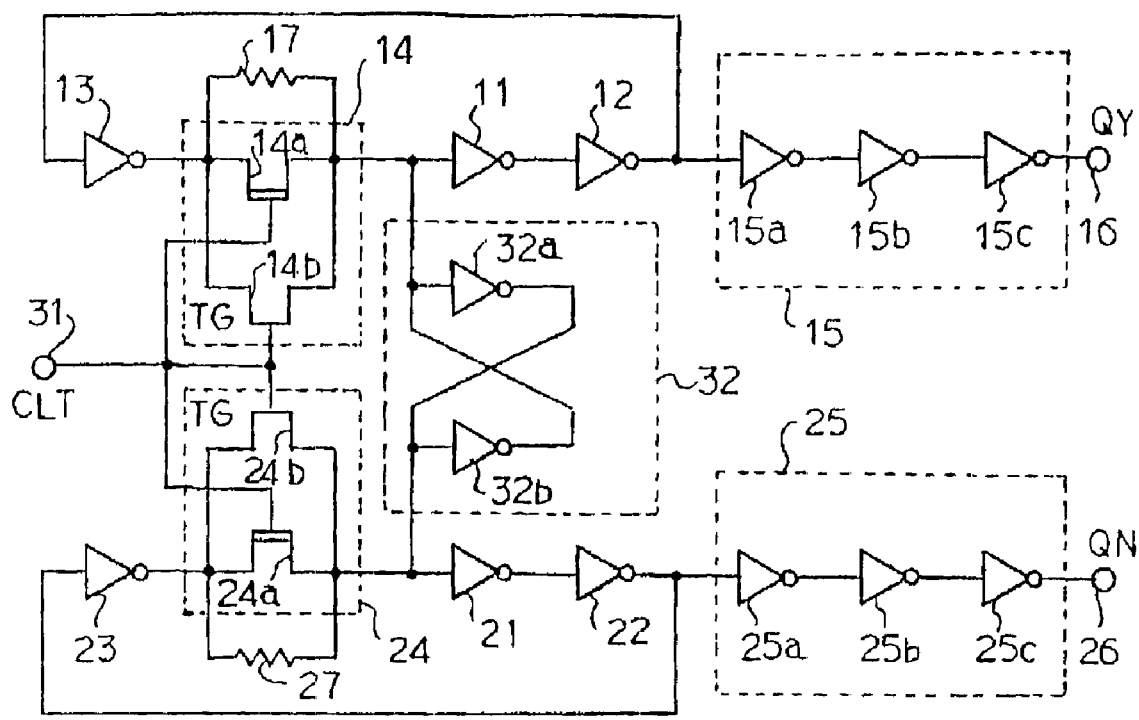
FIG. 1 is a circuit diagram of a VCO showing a first embodiment of the present invention.

FIG. 1 is a circuit diagram of a VCO showing a first embodiment of the present invention.

This type of VCO is one of a ring oscillation type for generating a-clock signal of a logical circuit, for example, and has an inverting amplifier circuit which comprises an odd number of (e.g., three) inverting amplifiers (e.g., inverters) 11 through 13 connected in tandem. The output of the inverter 13 is electrically connected to the input of the inverter 11 through a TG 14 wherein feedback transistors (e.g., a depletion type field-effect transistor (hereinafter called "DFET") 14a and an enhancement type field-effect transistor (hereafter called "EFET") 14b) are connected in parallel. Further, a feedback resistor 17 s electrically connected in parallel with the TG 14. An output buffer 15 comprised of cascade-connected inverters 15a through 15c is electrically connected to the output of the inverter 12. The output of the output buffer 15 is electrically connected to an output terminal 16.

The VCO has three cascade-connected inverters 21 through 23. The output of the inverter 23 is electrically connected to the input of the inverter 21 through a TG 24 wherein a DFET 24a and an EFET 24b are connected in parallel. Further, a feedback resistor 27 is electrically connected in parallel with the TG 24. An output buffer 25 comprised of cascade-connected inverters 25a through 25c is electrically connected to the output of the inverter 22. The output of the output buffer 25 is electrically connected to an output terminal 26.

Control electrodes (e.g., gates) of the DFETs 14a and 24a and the EFETs 14b and 24b constituting the TGs 14 and 24 respectively are electrically connected to a control terminal 31 supplied with a control voltage CLT. Further, the outputs of the TGs 14 and 24 are connected to each other by a latch 32 comprised of two inverters 32a and 32b. Namely, the input of the inverter 32a is electrically connected to the output of the TG 14, and the output of the inverter 32a is electrically connected to the output of the TG 24. Further, the input of the inverter 32b is electrically connected to the output of the TG 24, and the output of the inverter 32b is electrically connected to the output of the TG 14. The latch 32 always controls a signal outputted from a ring oscillator comprised of the inverters 11 through 13 and the TG 14 and a signal outputted from a ring oscillator comprised of the inverters 21 through 23 and the TG 24 so that ring oscillators output complementary oscillation signals. In the present embodiment, GaAs MESFETs are used as circuit elements to perform a high-speed operation.

The operation of the VCO will next be described.

In the VCO, the ring oscillator comprised of the inverters 11 through 13, the TG 14 and the resistor 17 performs an oscillating operation at a frequency corresponding to its loop delay time. The loop delay time corresponds to the sum of delay times produced in the inverters 11 through 13, and a delay time developed in a parallel circuit comprised of the TG 14 and the resistor 17. Of the total delay time, the delay time of the TG 14 changes according to the control voltage CLT applied to the control terminal 31. Namely, when the control voltage CLT is lowered, the TG 14 increases in channel resistance and the combined resistance of the TG 14 and the resistor 17 increases, thus resulting in an increase in delay time and a reduction in oscillation frequency. When the control voltage CLT increases in reverse, the channel resistance of the TG 14 becomes small and the combined resistance of the TG 14 and the resistor 17 decreases, thus resulting in a decrease in delay time and an increase in oscillation frequency.

Even in the case of the ring oscillator comprised of the inverters 21 through 23 and the resistor 27, the oscillation frequency is controlled according to the control voltage CLT in a manner similar to the above.

These two ring oscillators are connected to each other through the latch 32 by which their output signals are controlled so as to output inverted oscillation signals. A part of the signal outputted from the inverter 12 is outputted as an oscillation signal QY from the output terminal 16 via the output buffer 15. On the other hand, a part of the signal outputted from the inverter 22 is outputted from the output terminal 26 via the output buffer 25 as an oscillation signal QN opposite in polarity to the oscillation signal QY.

The output signals of the inverting amplifier circuits each comprised of the odd number of inverting amplifiers are respectively fed back to the inputs of the inverting amplifier circuits through the feedback transistors whose conducting states are controlled according to the control voltage, and the feedback resistors connected in parallel therewith to perform the oscillating operations. Since, at this time, the loop delay times differ from each other according to the conducting states of the feedback transistors, the transistors are controlled by the control voltage so that the oscillation frequencies of the VCO can be controlled. The suitable setting of the value of the resistor parallel-connected to each transistor makes it possible to bring a variable range of the oscillation frequency to a desired value.

Figure 2:
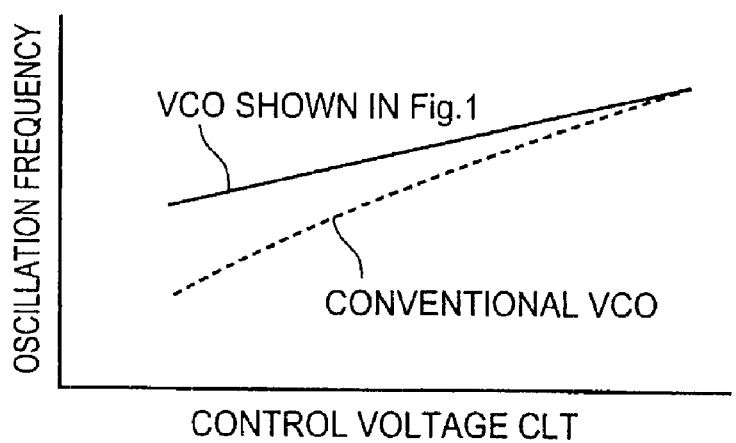
FIG. 2 is a conceptual diagram showing a frequency response of the VCO shown in Fia. 1.

FIG. 2 is a conceptual diagram showing a frequency response of the VCO shown in FIG. 1. A horizontal axis thereof indicates a control voltage CLT, and a vertical axis thereof indicates an oscillation frequency. The relationship between the control voltage CLT and the oscillation frequency is conceptually shown in solid line in the drawing. Incidentally, a broken line in FIG. 2 indicates a frequency response of a conventional VCO, which has been described for comparison.

As shown in FIG. 2, when the control voltage CLT is high, the TGs 14 and 24 are reduced in channel resistance, and the influence of the resistors 17 and 27 connected in parallel with the TGs 14 and 24 is lessened. Thus, the difference between the oscillation frequencies of the conventional VCO and the VCO shown in FIG. 1 is small.

On the other hand, when the control voltage CLT is lowered, the channel resistances of the TG 14 and 24 increase and hence the resistors 17 and 27 connected in parallel with the TGs 14 and 24 become predominant. Thus, even if the control voltage CLT is reduced, the combined resistances of the TGs 14 and 24 and the resistors 17 and 27 are not so high and hence a decrease in the oscillation frequency is low. On the other hand, since the resistors 17 and 27 are not connected in parallel with the TGs 14 and 24 in the conventional VCO, the oscillation frequency is greatly reduced according to the increase in the channel resistance of each of the TGs 14 and 24 as indicated by the broken line in FIG. 2.

Since the resistors 17 and 27 are respectively connected in parallel with the TGs 14 and 24 in the VCO according to the first embodiment as described above, the variable range of each of the combined resistances of these TGs 14 and 24 and resistors 17 and 27 can be narrowed. Thus, an advantage is brought about in that the suitable selection of the values of the resistors 17 and 27 allows the setting of a desired oscillation frequency control range, and a synchronous pull-in time can be shortened when PLL is used in the VCO.

Figure 3:
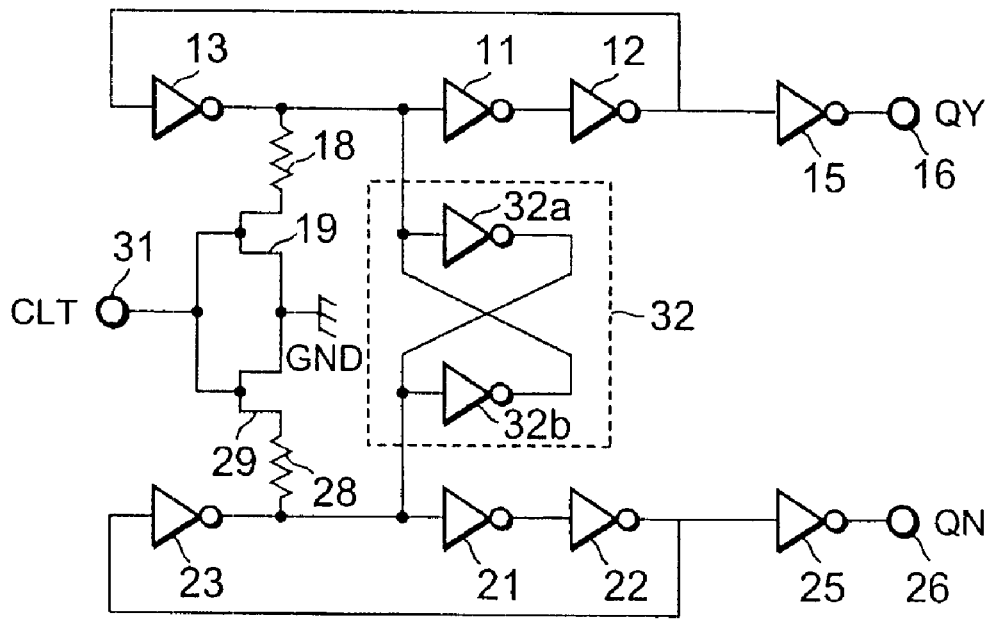
FIG. 3 is a circuit diagram of a VCO showing a second embodiment of the present invention.

FIG. 3 is a circuit diagram of a VCO showing a second embodiment of the present invention. Elements of structure common to the elements shown in FIG. 1 are respectively identified by the common reference numerals.

In a manner similar to the VCO shown in FIG. 1, the present VCO is one of a ring oscillation type for generating a clock signal of a logical circuit, for example, and has three inverters 11 through 13 connected in ring form. The output of the inverter 13 is electrically connected to the input of the inverter 11 and connected to the drain of a load FET 19 through a load resistor 18. The source of the FET 19 is electrically connected to a common potential (e.g., ground potential) GND. The gate of the FET 19 is electrically connected to a control terminal 31 and supplied with a control voltage CLT. The output of the inverter 12 is electrically connected to an output terminal 16 through an output buffer 15.

Similarly, the VCO has three inverters 21 through 23 connected in ring form. The output of the inverter 23 is electrically connected to a ground potential GND through a resistor 28 and an FET 29 connected in series. The gate of the FET 29 is electrically connected to the control terminal 31 and supplied with the control voltage CLT. The output of the inverter 22 is electrically connected to an output terminal 26 through an output buffer 25. Further, the outputs of the inverters 13 and 23 are electrically connected to each other by a latch 32.

The operation of the present embodiment will next be described.

The inverters 11 through 13 and the inverters 21 through 23 connected in ring form are respectively operated as three-stage ring oscillators. The latch 32 antiphase-drives the two ring oscillators. Thus, oscillation signals QY and QN identical in frequency and opposite in polarity to each other are outputted from the output terminals 16 and 26.

At this time, a series circuit comprised of the resistor 18 and the FET 19 connected between the output of the inverter 13 and the ground potential GND, and a series circuit comprised of the resistor 28 and the FET 29 connected between the output of the inverter 23 and the ground potential GND respectively operate as loads of the ring oscillators.

A ring oscillator comprised of an odd number of inverting amplifiers connected in ring form performs an oscillating operation at a frequency corresponding to its loop delay time. At this time, an oscillation frequency changes according to the load on each load transistor connected between the output of each inverting amplifier and a power source or supply or a common potential. Thus, a control voltage applied to a control electrode of the load transistor can be changed so as to control the magnitude of the load and an oscillation frequency.

Figure 4:
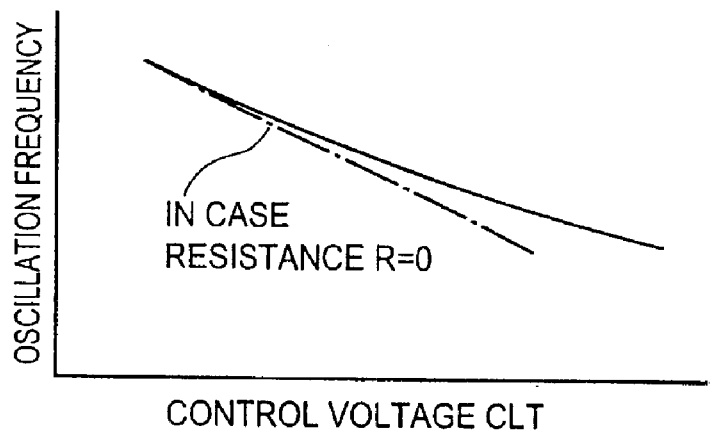
FIG. 4 is a conceptual diagram illustrating a characteristic response of the VCO shown in FIG. 3.

FIG. 4 is a conceptual diagram showing a frequency response of the VCO shown in FIG. 3. A horizontal axis thereof indicates a control voltage CLT, and a vertical axis thereof indicates an oscillation frequency. The relationship between the control voltage CLT and the oscillation frequency is conceptually shown in solid line in the drawing. Incidentally, a dashed line in FIG. 4 indicates a frequency response obtained when the resistance values R of the resistors 18 and 28 are set to zero.

As shown in FIG. 4, when the control voltage CLT is low, the channel resistances of the FETs 19 and 29 are almost assumed to be infinite and hence the loads on the inverters 13 and 23 are virtually nonexistent. Thus, the highest frequency substantially corresponding to a loop delay time of the inverters 11 through 13 is obtained as the oscillation frequency. Namely, when the control voltage CLT is low, the values of the channel resistances of the FETs 19 and 29 become predominant as compared with the resistance values of the resistors 18 and 28. Thus, the difference developed between the oscillation frequencies at the low control voltage CLT by the resistance values of the resistors 18 and 28 is small.

On the other hand, when the control voltage CLT increases, the channel resistances of the FETs 19 and 29 become low and hence the loads on the inverters 13 and 23 increase, whereby the oscillation frequencies are reduced. Since the resistors 18 and 28 are respectively connected in series with the FETs 19 and 29, the values of the resistors 18 and 28 become predominant in this case. Namely, when the control voltage CLT is high, an increase in load becomes great as the values of the resistors 18 and 28 decrease, whereby the proportion of a reduction in oscillation frequency becomes large.

In the VCO according to the second embodiment as described above, the series circuit comprised of the resistors 18 and 19 and the series circuit comprised of the resistors 28 and the FET 29 are connected between the outputs of the inverters 13 and 23 respectively constituting the ring oscillators and the ground potential GND, as the loads.

Thus, the control of the channel resistances of the FETs 19 and 29 by the control voltage CLT makes it possible to change the loads of the ring oscillators from nearly zero to a predetermined value. Accordingly, an advantage is brought about in that a desired oscillation frequency control range can be set by suitably selecting the values of the resistors 18 and 28.

A further advantage is brought about in that since the load of each ring oscillator can be set to nearly zero by lowering the control voltage CLT, a high oscillation frequency is obtained without lowering the oscillatable highest frequency.

Figure 5:
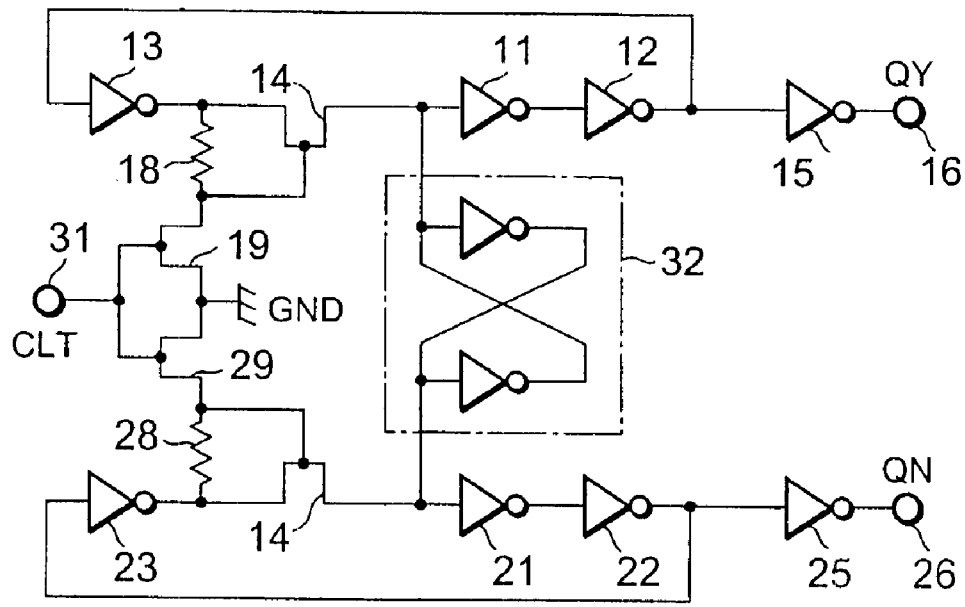
FIG. 5 is a circuit diagram of a VCO showing a third embodiment of the present invention.

FIG. 5 is a circuit diagram of a VCO showing a third embodiment of the present invention. Elements of structure common to the elements shown in FIGS. 1 and 3 are respectively identified by the common reference numerals.

The present VCO is a modification of the VCO shown in FIG. 3 and has a combined configuration of the VCOs shown in FIGS. 1 and 3. Namely, the VCO has a ring oscillator wherein three inverters 11 through 13 and a TG 14 are connected in ring form, and a ring oscillator wherein three inverters 21 through 23 and a TG 24 are connected in ring form. Further, a resistor 18 and an FET 19 connected in series are electrically connected between the output of the inverter 13 and a ground potential GND. A resistor 28 and an FET 29 connected in series are electrically connected between the output of the inverter 23 and the ground potential GND. The gates of the FETs 19 and 29 are electrically connected to a control terminal 31, and voltages applied to the drains of these FETs 19 and 29 are supplied as control voltages for the TGs 14 and 29.

In the present VCO in a manner similar to the VCO shown in FIG. 3, a series circuit comprised of the resistors 18 and the FET 19 electrically connected between the output of the inverter 13 and the ground voltage GND, and a series circuit comprised of the resistor 28 and the FET 29 electrically connected between the output of the inverter 23 and the ground potential GND are respectively operated as loads of the ring oscillators. Thus, when a control voltage CLT supplied to the control terminal 31 rises, the channel resistances of the FETs 19 and 29 decrease and hence the loads of theses ring oscillators increase, whereby oscillation frequencies are lowered.

Simultaneously, the drain voltages of the FETs 19 and 29 are reduced and the control voltages for the TGs 14 and 24 are lowered. Therefore, the TGs 14 and 24 increase in channel resistance and hence a loop delay time becomes long, whereby the oscillation frequencies of the ring oscillators are further lowered. Accordingly, the present VCO can extend the control range of the oscillation frequencies as compared with the VCO shown in FIG. 4.

Incidentally, the present invention is not limited to the above-described embodiments. Various changes can be made thereto. For example, the following (a) through (g) are included as modifications thereof.

(a) The circuit elements constituting the VCO are not limited to GaAs MESFETs.

(b) The number of the inverters constituting the ring oscillator is not limited to the three. The number thereof may be an odd number. This number is determined according to a delay time of each inverter and a desired oscillation frequency.

(c) The configurations of the TGs 14 and 24 are not limited to those shown in FIG. 1. Namely, such ones as to be capable of obtaining desired conduction characteristics can be selected as the number and characteristics of parallel-connected transistors.

(d) When the wide frequency control range is needed in FIG. 4, the values of the resistors 18 and 28 may be set to zero. Namely, the resistors 18 and 28 may be omitted.

(e) While one ends of the FETs 19 and 29 are electrically connected to the ground potential GND in FIGS. 3 and 5, they might be connected to an unillustrated source potential according to the type of FET.

(f) The configurations of the output buffers 15 and 25 are not limited to the illustrated ones.

(g) While the two ring oscillators are connected to each other by the latch 32 so as to output the oscillation signals QY and QN opposite in polarity to each other, such a configuration may be set by one ring oscillator alone. In this case, the latch 32 is unnecessary.

According to the first embodiment as described above in detail, feedback resistors are respectively connected in parallel with feedback transistors which are connected to the outputs and inputs of inverting amplifier circuits and whose conducting states are changed by a control voltage. Thus, the suitable setting of the value of each resistor makes it possible to arbitrarily restrict a variable range of a conducting state and set a desired oscillation frequency control range. Further, an advantage is brought about in that when PLL is used, a synchronous pull-in time can be shortened.

According to the second embodiment, load transistors whose conducting states are changed according to a control voltage, are connected to the outputs of inverting amplifiers constituting ring oscillators respectively. Thus, oscillation frequencies can be controlled without lowering the maximum values thereof.

According to the third embodiment, resistors are connected in series with load transistors employed in a second invention. Thus, the suitable setting of the value of each resistor makes it possible to arbitrarily restrict a variable range of load's values and set a desired oscillation frequency control range.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A voltage-controlled oscillator comprising:

a control applied to a control terminal a first output terminal;

a second output terminal;

a first ring oscillator including an odd number of first inverting amplifier circuits connected in series and a first transfer gate circuit connected between the first inverting amplifier circuits, wherein the first transfer gate circuit includes a first transfer transistor connected between the first inverting amplifier circuits and having a control terminal connected to said control terminal, and a first resistive element connected in parallel to the first transfer transistor;

a second ring oscillator including an odd number of second inverting amplifier circuits connected in series and a second transfer gate circuit connected between the second inverting amplifier circuits, wherein the second transfer gate circuit includes a second transfer transistor connected between the second inverting amplifier circuits and having a control terminal connected to said control terminal, and a second resistive element connected in parallel to the second transfer transistor;

a latch circuit connected to said first and second ring oscillators, said latch circuit controlling said first and second ring oscillators so as to output complement oscillation signals;

a first output buffer circuit having an input connected to said first ring oscillator and an output connected to the first output terminal; and a second output buffer circuit having an input connected to said second ring oscillator and an output connected to the second output terminal.

2. A voltage-controlled oscillator according to claim 1, wherein the number of the first inverting amplifier circuits is equal to the number of the second inverting amplifier circuits.

3. A voltage-controlled oscillator according to claim 1, wherein the first and second transfer gate transistors are depletion type field-effect transistors.

4. A voltage-controlled oscillator according to claim 1, wherein the first transfer gate circuit further comprises an enhancement type field-effect transistor connected in parallel to the first transfer gate transistor, and wherein the second transfer gate circuit further comprises an enhancement type field-effect transistor connected in parallel to the second transfer gate transistor.

5. A voltage-controlled oscillator according to claim 1, wherein the first and second transfer gate transistors are enhancement type field-effect transistors.

6. A voltage-controlled oscillator according to claim 1, wherein the voltage-controlled oscillator is composed of GaAs MESFETs.

7. A voltage-controlled oscillator according to claim 1, wherein each of said first and second output buffer circuits includes an odd number of inverting amplifier circuits.

* * * * *